United States Patent
Dupuis et al.

(10) Patent No.: US 7,551,032 B2
(45) Date of Patent: Jun. 23, 2009

(54) METHOD AND APPARATUS FOR CONTROLLING THE OUTPUT POWER OF A POWER AMPLIFIER

(75) Inventors: Timothy J. Dupuis, Austin, TX (US); Ryan M. Bocock, Austin, TX (US)

(73) Assignee: Black Sand Technologies, Inc., Austin, TX (US)

( * ) Notice: Subject to any disclaimer, the term of this patent is extended or adjusted under 35 U.S.C. 154(b) by 0 days.

(21) Appl. No.: 11/468,324

(22) Filed: Aug. 30, 2006

(65) Prior Publication Data

US 2007/0063774 A1     Mar. 22, 2007

Related U.S. Application Data

(63) Continuation of application No. 10/880,962, filed on Jun. 30, 2004, now Pat. No. 7,106,137, which is a continuation of application No. 10/378,779, filed on Mar. 4, 2003, now Pat. No. 6,897,730.

(51) Int. Cl.
*H03G 3/10* (2006.01)

(52) U.S. Cl. .................. 330/285; 330/296; 330/297

(58) Field of Classification Search ............... 330/285, 330/297, 296, 129
See application file for complete search history.

(56) References Cited

U.S. PATENT DOCUMENTS

| | | | | |
|---|---|---|---|---|
| 5,142,219 | A | * | 8/1992 | Hsu et al. .................. 323/314 |
| 6,081,161 | A | | 6/2000 | Dacus et al. |
| 6,137,354 | A | * | 10/2000 | Dacus et al. .................. 330/51 |
| 6,566,944 | B1 | * | 5/2003 | Pehlke et al. .................. 330/10 |
| 6,614,309 | B1 | * | 9/2003 | Pehlke .......................... 330/296 |
| 6,653,902 | B1 | * | 11/2003 | Bachhuber et al. ........... 330/285 |
| 7,268,621 | B2 | * | 9/2007 | Kanoh et al. ................. 330/251 |

FOREIGN PATENT DOCUMENTS

| WO | WO0048307 | 8/2000 |
|---|---|---|
| WO | WO02097972 | 12/2002 |

* cited by examiner

*Primary Examiner*—Patricia Nguyen
(74) *Attorney, Agent, or Firm*—Johnson & Associates

(57) ABSTRACT

A method and apparatus is provided for use with a power amplifier to provide a regulated supply to the power amplifier. The invention uses a combination of voltage and current regulation to overcome the problems encountered in the prior art. In one example, voltage regulation is used at high power levels, while current regulation is used at low power levels.

16 Claims, 4 Drawing Sheets

METHOD AND APPARATUS FOR CONTROLLING THE OUTPUT POWER OF A POWER AMPLIFIER

CROSS REFERENCE TO RELATED APPLICATIONS

This application is a continuation of commonly owned U.S. patent application Ser. No. 10/880,962 filed on Jun. 30, 2004, entitled "METHOD AND APPARATUS FOR CONTROLLING THE OUTPUT POWER OF A POWER AMPLIFIER," (U.S. Pat. No. 7,106,137) which is a continuation of commonly owned U.S. patent application Ser. No. 10/378,779 filed on Mar. 4, 2003, entitled "METHOD AND APPARATUS FOR CONTROLLING THE OUTPUT POWER OF A POWER AMPLIFIER" (U.S. Pat. No. 6,897,730). This application is related to Ser. No. 09/660,123, entitled "POWER AMPLIFIER CIRCUITRY AND METHOD USING AN INDUCTANCE COUPLED TO POWER AMPLIFIER SWITCHING DEVICES", by Susanne A. Paul et al. (U.S. Pat. No. 6,549,071), which is expressly incorporated by reference herein.

FIELD OF THE INVENTION

This invention relates to power amplifiers. In particular, this invention relates to techniques for controlling the output power of power amplifiers.

BACKGROUND OF THE INVENTION

In some applications utilizing power amplifiers, there is a need to vary the output power delivered to a load. For example, in a cell phone environment, it is desired to vary the output power of the cell phone based on various factors. For example, a base station may dictate the power level at which each cell phone should transmit (based on factors such as the physical distance from the base station, for example).

A standard method of controlling the output power of a power amplifier is to use a voltage regulator to regulate the battery or power supply voltage. Typical approaches to controlling the output power of a power amplifier use an "open loop" or a "closed loop" control technique. Closed loop techniques use an RF sensor, such as a directional coupler, to detect the power amplifier output power. The detected output power is used in a feedback loop to regulate the output power. "Open loop" techniques control the output power by regulating either the power supply voltage or power supply current used by the power amplifier. Open loop techniques are popular since open loop techniques do not have the loss and complexity associated with RF sensor elements.

Open loop techniques have several problems. For example, because output sensing is not used, components using open loop techniques suffer from inaccuracies and part-to-part variations. It would be desirable to use an open loop technique which achieves low thermal and minimal part-to-part variation.

FIGS. 1 and 2 show two prior art examples of open loop techniques for regulating the output power of a power amplifier. FIG. 1 is a schematic diagram showing an open loop voltage regulation technique. FIG. 1 shows a power amplifier 100 and a voltage regulator 102. The voltage regulator 102 is comprised of switching device M1, op-amp 104, and a feedback loop. The voltage regulator 102 provides a regulated voltage to the power amplifier 100, based on the voltage sensed and a desired power level indicated by an automatic power control signal $V_{APC}$. FIG. 2 is a schematic diagram showing an open loop current regulation technique. Like FIG. 1, FIG. 2 shows a power amplifier 100 and a voltage regulator 102. The voltage regulator 102 is comprised of switching device M1, op-amp 104, a current sense resistor R1, and a feedback loop. The voltage regulator 102 provides a regulated current to the power amplifier 100. based on the current sensed through resistor R1 and a desired power level indicated by power control signal $V_{APC}$.

In general, voltage regulation is preferred in an open loop design since voltage regulation does not suffer from the loss associated with a current sensing element, such as resistor R1 in FIG. 2. However, in many power amplifier designs, and especially in CMOS designs, voltage regulation can result in large thermal and part-to-part variations. These problems are caused in part by thermal voltage ($V_T$) variations in transistors, which result in large power variations at low power, when the regulated voltage is close to the thermal voltage ($V_T$) limit.

SUMMARY OF THE INVENTION

A circuit of the invention is provided for controlling the output power of a power amplifier comprising: a voltage sensor; a current sensor; and control circuitry coupled to the voltage sensor and the current sensor for controlling the output power of the power amplifier.

Another embodiment of the invention provides a power regulator for use with a power amplifier, the power regulator comprising: a voltage regulator; a current regulator; and control circuitry coupled to the voltage regulator and to the current regulator for regulating the output power of the power amplifier using the voltage regulator and the current regulator.

Another embodiment of the invention provides an integrated circuit comprising: a power amplifier; a voltage sensor; a current sensor; and control circuitry coupled to the voltage sensor and the current sensor for controlling the output power of the power amplifier using information from the voltage and current sensors.

Another embodiment of the invention provides a method of controlling the output power of a power amplifier comprising: providing a voltage regulator; providing a current regulator; and controlling the output power of a power amplifier using the voltage regulator at high power levels and using the current regulator at low power levels.

Another embodiment of the invention provides a method of controlling the output power of a power amplifier comprising: sensing current provided to the power amplifier; sensing voltage provided to the power amplifier; selectively using the sensed current and sensed voltage to control the output power of the power amplifier.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In order to provide a context for understanding this description, the following illustrates an example of a typical application of the present invention. A power amplifier using the power control techniques of the present invention may be used with a wireless transmission system such as a wireless telephone or other device. In a wireless device such as a cellular telephone, the wireless device may include a transceiver, an antenna duplexer, and an antenna. Connected between the transceiver and the antenna duplexer is an RF power amplifier for amplifying signals for transmission via the antenna. In the case of a wireless telephone application, the invention may be applied to GSM, CDMA, PCS, DCS, etc., or other wireless systems. This is just one example of an application of a power amplifier utilizing the present invention. The invention may also be used in any other application requiring a power amplifier.

Generally, the present invention uses a combination of voltage and current regulation to regulate the output power of a power amplifier. In one example, voltage regulation is used at high power levels (i.e., a first output voltage range), while current regulation is used at low power levels (i.e., a second output voltage range).

Figure 3:
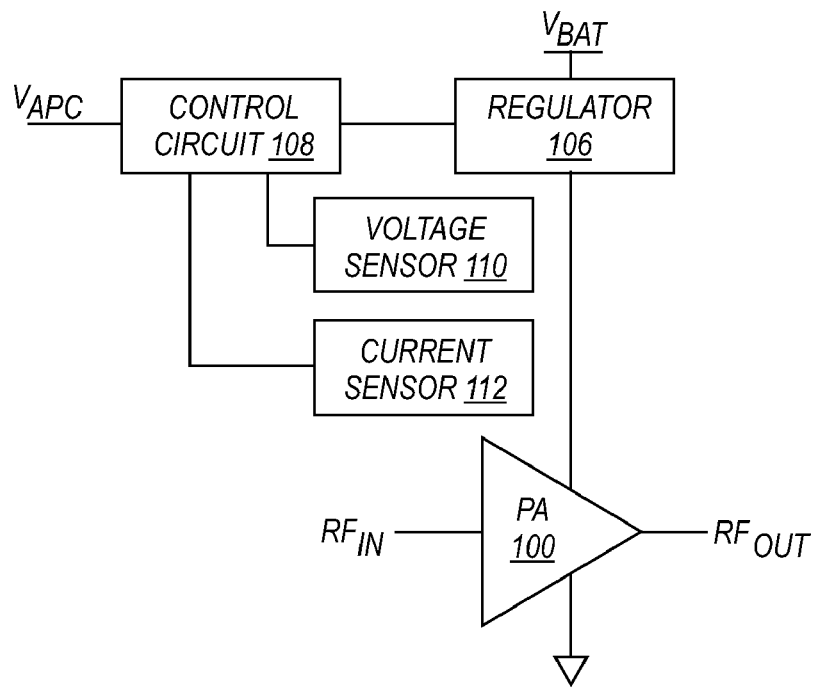
FIG. 3 is a block diagram of one example of a power regulation technique of the present invention.

FIG. 3 is a block diagram of one example of a power regulation technique of the present invention. FIG. 3 shows a power amplifier 100 and a regulator 106. Connected to the regulator 106 is a control circuit 108. The control circuit 108 is connected to a power control signal $V_{APC}$, a voltage sensor 110, and a current sensor 112. The control circuit 108 and regulator 106 control the output power of the power amplifier 100 based on the power control signal $V_{APC}$ and the sensed voltage and current. In one example, the power amplifier 100 is powered using voltage regulation at high power levels and current regulation at low power levels. In this example, at high power levels, the control circuit 108 and regulator 106 use the sensed voltage to regulate the output power of the power amplifier 100. At low power levels, the control circuit 108 and regulator 106 use the sensed current to regulate the output power of the power amplifier 100.

Figure 4:
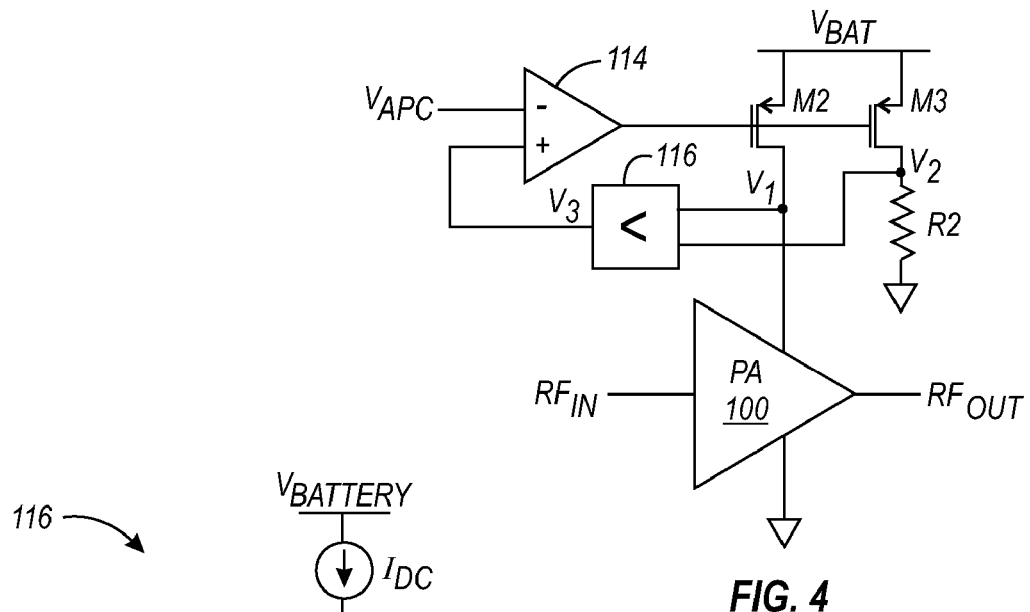
FIG. 4 is a schematic diagram illustrating one implementation of the present invention.

FIG. 4 is a schematic diagram illustrating one implementation of the circuit shown in FIG. 3. FIG. 4 shows an op-amp 114 with one input connected to $V_{APC}$ and a second input connected to the output $V_3$ of a less than block 116. One example of a less than block is described below with respect to FIG. 5. The less than block 116 has two inputs. A first input $V_1$ is connected to the node between the power amplifier 100 and a first switching device M2. A second input $V_2$ is connected to the node between a second switching device M3 and a current sense resistor R2. The voltage of the output $V_3$ of the less than block 116 will approximate the lesser of the inputs $V_1$ and $V_2$, as illustrated in the following equations:

$V_3 = V_1$, when $V_1 < V_2$; and $V_3 = V_2$, when $V_2 < V_1$.

In the circuit shown in FIG. 4, switching devices M2 and M3 operate as a current mirror, with M3 being much smaller than M2. Resistor R2 is sized such that, at high power, switching device M3 will saturate and $V_2$ will be close to $V_{BAT}$. Therefore, $V_1$ will be less than $V_2$ at high power levels, and $V_3$ will be equal to $V_1$. With $V_3$ equal to $V_1$, the circuit operates as a voltage regulator (since the power amplifier is controlled by sensing the voltage at V1). At low power levels, $V_1$ becomes higher than $V_2$ due to the threshold voltage non-linearity of the power amplifier 100. Therefore, V3 will be equal to $V_2$ at low power levels. With $V_3$ equal to $V_2$, the circuit operates as a current regulator (since the power amplifier is controlled by sensing the current provided to resistor R2). In the embodiment described above, V3 approximates V1 or V2. In another example, V3 may not approximate V1 or V2, but is related to one or the other. For example, at high power levels, V3 can be proportional to V1 without approximating V1. Similarly, at low power levels, V3 can be proportional to V2 without approximating V2. Other embodiments are also possible.

Figure 5:
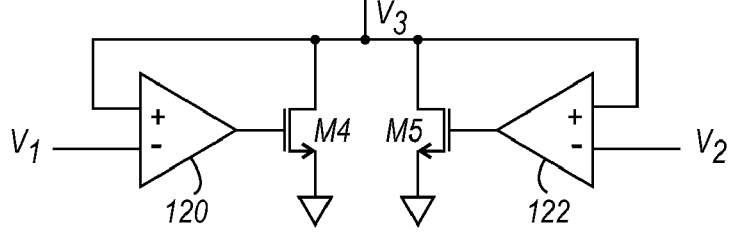
FIG. 5 is a schematic diagram of a less than circuit.

The less than block 116 shown in FIG. 4 can be implemented in any desired way. Following is a description of one example of a circuit for providing a less than function. FIG. 5 is a schematic diagram of a less than circuit 116. As mentioned above, the less than block 116 has an output $V_3$ that is approximately equal to the lesser of inputs $V_1$ and $V_2$. The implementation shown in FIG. 5 shows a first op-amp 120 having two inputs connected to $V_1$ and $V_3$. A second op-amp 122 has two inputs connected to $V_2$ and $V_3$. A DC current source $I_{DC}$ is also provided to $V_3$. The output of op-amp 120 is provided to a switching device M4, which is coupled between $V_3$ and a reference node (e.g., ground). The output of op-amp 122 is provided to a switching device M5, which is also coupled between $V_3$ and a reference node (e.g., ground). Op-amps 120 and 122, in combination with switching devices M4 and M5, are only capable of sinking current from $V_3$. When $V_1$ is greater than $V_2$ (at low power), the gate of switching device M4 is forced to ground and M4 turns off. $V_3$ is then equal to $V_2$. Similarly, when $V_2$ is greater than $V_1$ (at high power), the gate of switching device M5 is forced to ground and M5 turns off. $V_3$ is then equal to $V_1$. If $V_1$ and $V_2$ are equal, switching devices M4 and M5 will both be turned on and current from current source $I_{DC}$ will be split between them such that $V_3 = V_1 = V_2$.

Figure 1:
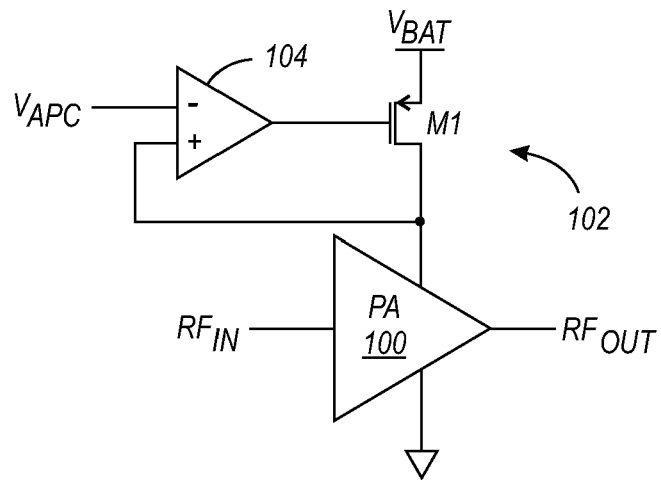
FIG. 1 is a schematic diagram showing an open loop voltage regulation technique.
Figure 2:
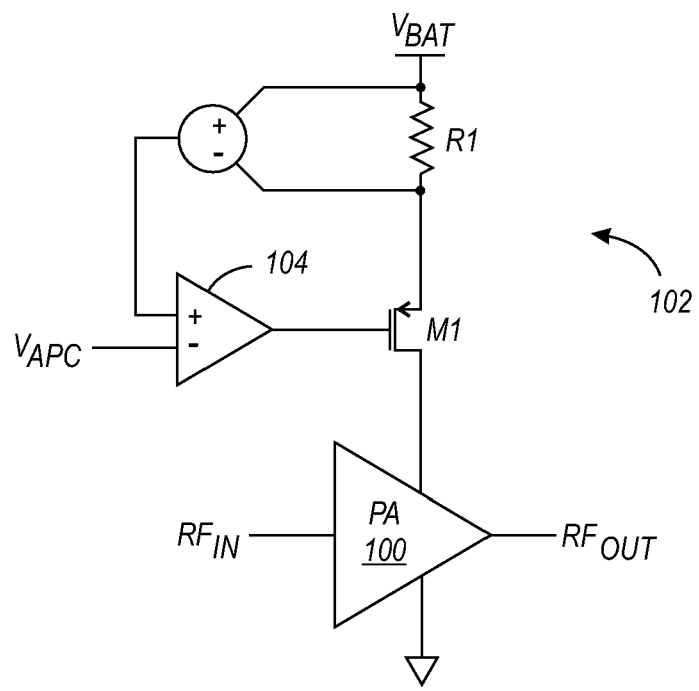
FIG. 2 is a schematic diagram showing an open loop current regulation technique.
Figure 6:
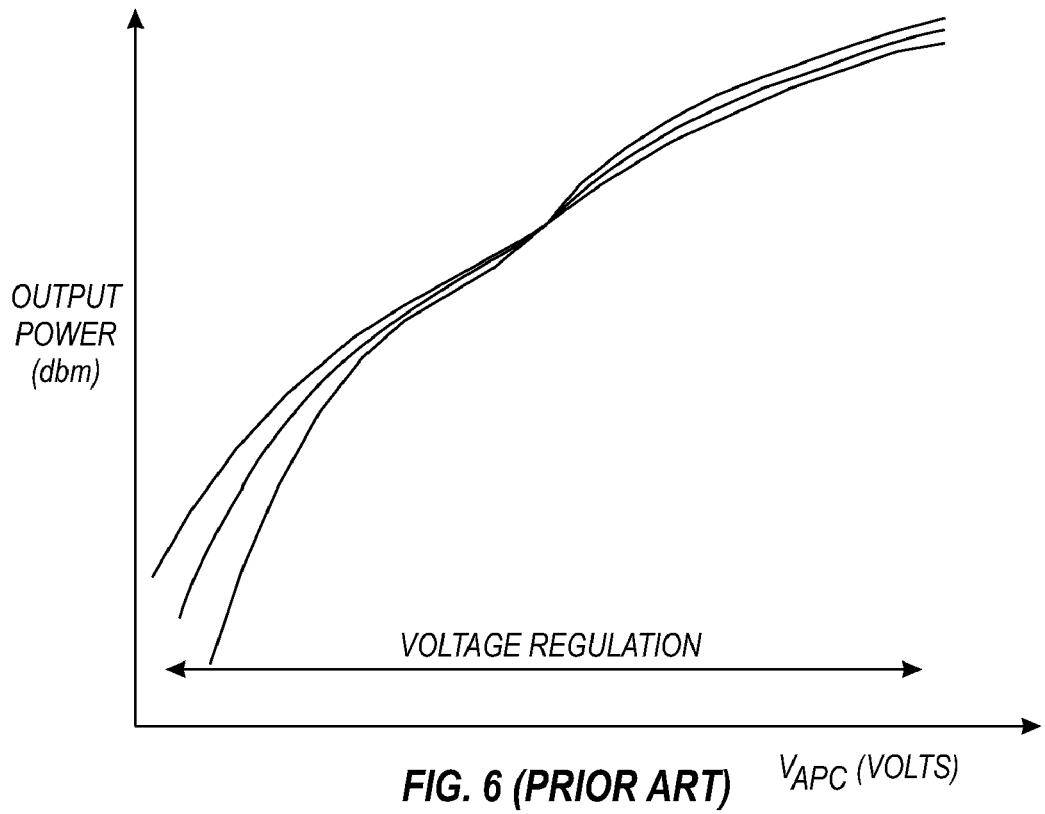
FIGS. 6 and 7 are plots illustrating the improved performance of the present invention.
Figure 7:
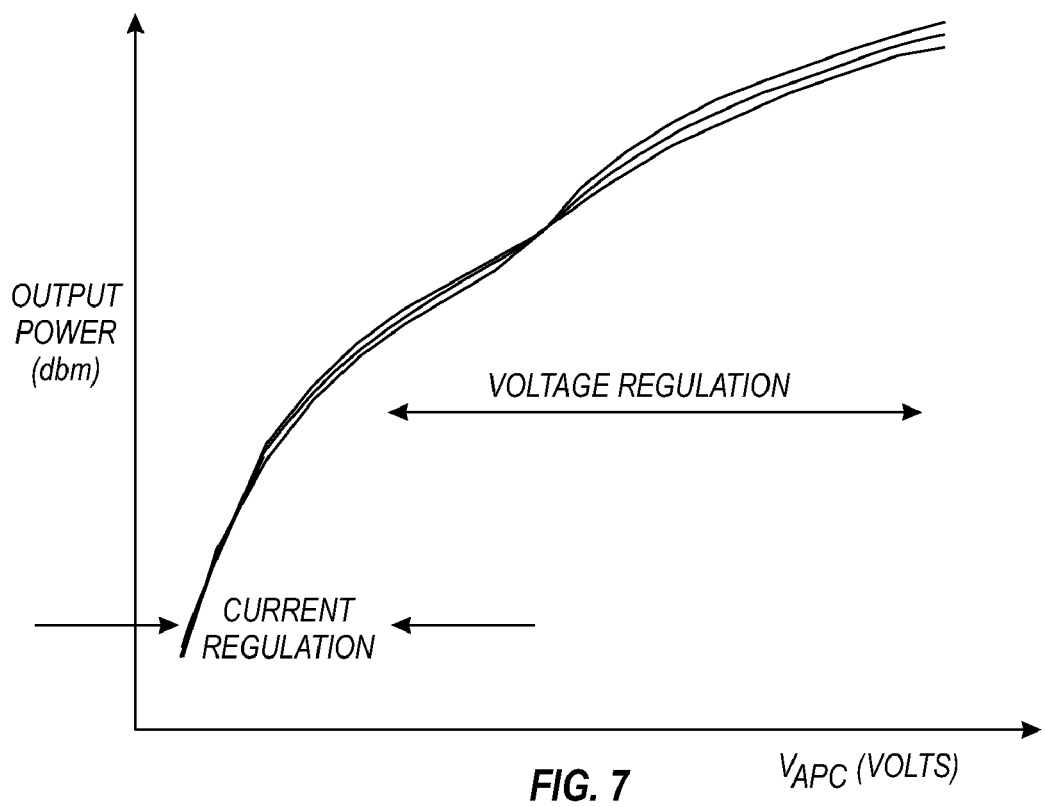

FIGS. 6 and 7 are plots illustrating the improved performance of the present invention. FIG. 6 is a plot of the output power (dbm) versus the voltage of a power control signal $V_{APC}$ at three different temperatures (e.g., high, nominal, and low temperatures) of a prior art power amplifier regulated by a voltage regulator (e.g., FIG. 1). As shown in FIG. 6, the output power variation is relatively small at higher power levels, but increases as the output power level decreases. Therefore, it can be seen that voltage regulation is satisfactory at high power levels, but is less reliable at low power levels.

The present invention takes advantage of the reliability of voltage regulation at high power levels, and the reliability of current regulation at low power levels. FIG. 7 is a plot similar to FIG. 6, illustrating the improvement provided by the present invention. At higher power levels, voltage regulation is used, resulting in plots similar to those shown in FIG. 6. As the power decreases, the regulator of the present invention changes from a voltage regulator to a current regulator, thereby improving the output power variation for the three temperatures shown.

Figure 8:
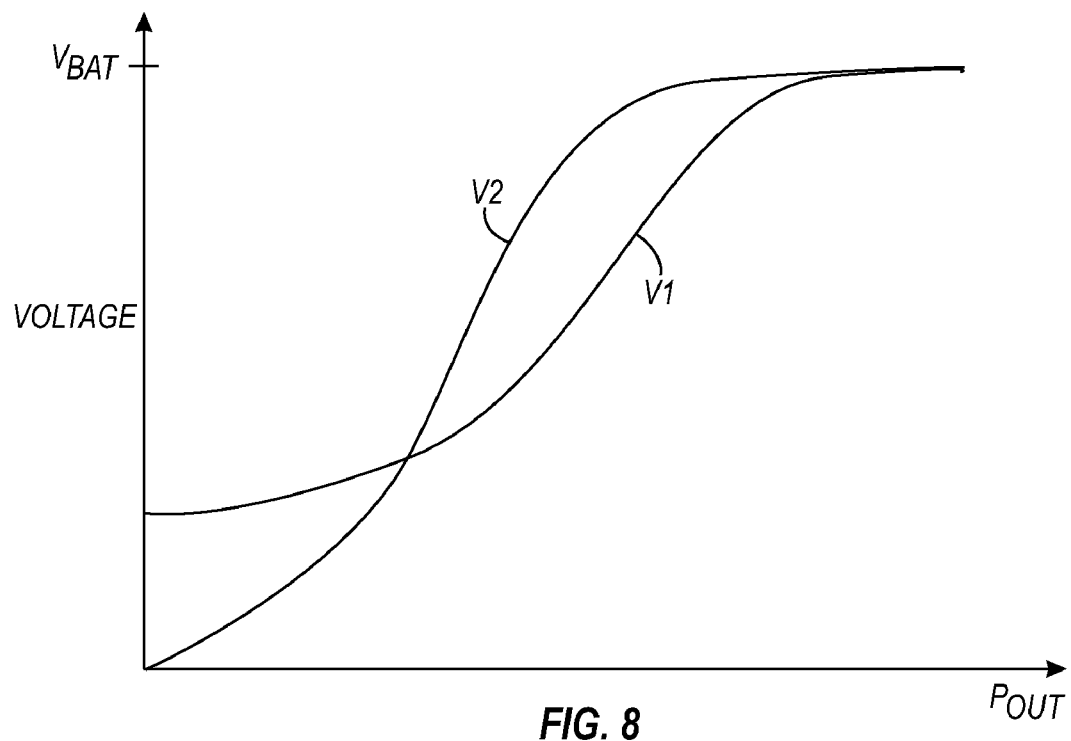
FIGS. 8 and 9 are timing diagrams illustrating the relationship between signals V1, V2 and V3.
Figure 9:
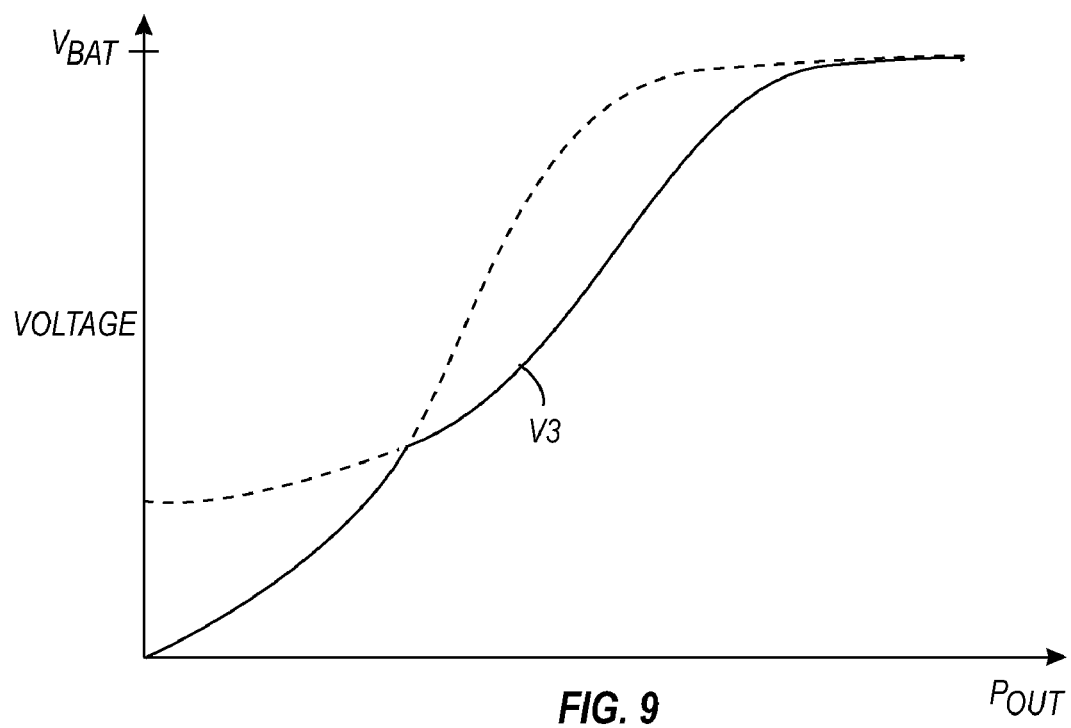

FIGS. 8 and 9 are timing diagrams illustrating the relationship between signals $V_1$, $V_2$ and $V_3$. FIG. 8 illustrates the voltage of signals $V_1$ and $V_1$ as a function of the output power ($P_{OUT}$) of the power amplifier. As shown, at higher power levels (the right portion of FIG. 8), $V_1$ is less than $V_2$. At lower power levels (the left portion of FIG. 8), $V_2$ is less than $V_1$. FIG. 9 illustrates the voltage of signal $V_3$ as a function of the output power ($P_{OUT}$) of the power amplifier. Since signal $V_3$ is equal to the lesser of $V_1$ and $V_2$, $V_3$ is similar to $V_2$ at lower power levels and similar to V1 at higher power levels. The remaining portions of $V_1$ and $V_2$ are shown by dashed lines to help illustrate the relationship between $V_3$ and $V_1$ and $V_2$. At the point where the $V_1$ and $V_2$ plots cross, the power control technique of the present invention switches between current regulation and voltage regulation.

The present invention may be used in conjunction with any device requiring a regulated power supply, such as power amplifiers. The invention may be implemented in an integrated circuit (e.g., CMOS, etc.) or implemented using discrete components. If desired, the invention can be implemented in the same integrated circuit that contains the device requiring the regulated power (e.g., a power amplifier, etc.).

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method of controlling the output power of a power amplifier comprising:
    sensing current provided to the power amplifier;
    sensing voltage provided to the power amplifier;
    selectively using the sensed current and sensed voltage to control the output power of the power amplifier, wherein the use of the sensed current or sensed voltage is based on the output power level of the power amplifier.

2. The method of claim 1, wherein at high power levels, the sensed voltage is used to control the output power of the power amplifier.

3. The method of claim 1, wherein at low power levels, the sensed current is used to control the output power of the power amplifier.

4. The method of claim 1, wherein the sensed voltage is used to control the power amplifier during a first output power level range and the sensed current is used to control the power amplifier during a second output power level range.

5. The method of claim 1, further comprising the steps of providing a voltage regulator and providing a current regulator, wherein the voltage regulator is used at high power levels and the current regulator is used at low power levels.

6. An RF apparatus used for wireless communications comprising:
    an RF power amplifier;
    a current regulator configured to provide a regulated supply current to the RF power amplifier;
    a voltage regulator configured to provide a regulated supply voltage to the RF power amplifier; and
    control circuitry coupled to the voltage regulator and to the current regulator for controlling the output power of the RF power amplifier, wherein the control circuitry is configured to selectively use the current regulator and the voltage regulator to control the output power of the power amplifier, wherein the selection of use of the current regulator or voltage regulator is based on the output power level of the power amplifier.

7. The RF apparatus of claim 6, wherein the control circuitry uses the voltage regulator at high output power levels, and uses the current regulator at low output power levels.

8. The power regulator of claim 6, further comprising a voltage sensor and a current sensor.

9. The RF apparatus of claim 8, wherein the control circuitry regulates the output power of the RF power amplifier based on voltage sensed by the voltage sensor and current sensed by the current sensor.

10. The RF apparatus of claim 8, wherein the voltage sensor generates a first signal and the current sensor generates a second signal.

11. The RF apparatus of claim 10, wherein the control circuitry uses either the first or second signals to control the output power of the power amplifier.

12. The RF apparatus of claim 11, wherein the control circuitry uses the signal having the lower voltage level to control the output power of the power amplifier.

13. A method of controlling the output power of an RF power amplifier comprising:
    determining the output power of the RF power amplifier;
    when the determined output power of the RF power amplifier falls within a first range, regulating the current supplied to the RF power amplifier to control the output power of the RF power amplifier; and
    when the determined output power of the RF power amplifier falls within a second range, regulating the voltage supplied to the RF power amplifier to control the output power of the RF power amplifier.

14. The method of claim 13, further comprising sensing current provided to the power amplifier.

15. The method of claim 14, further comprising sensing voltage provided to the power amplifier.

16. The method of claim 15, wherein the sensed voltage is used to control the power amplifier over the second range and the sensed current is used to control the power amplifier over the first range.

* * * * *